(12) United States Patent
Suzuki et al.

(10) Patent No.: US 11,399,148 B2
(45) Date of Patent: *Jul. 26, 2022

(54) SOLID-STATE IMAGING DEVICE AND IMAGING APPARATUS INCLUDING SAME

(71) Applicant: PANASONIC INTELLECTUAL PROPERTY MANAGEMENT CO., LTD., Osaka (JP)

(72) Inventors: Sei Suzuki, Osaka (JP); Junichi Matsuo, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 167 days.

This patent is subject to a terminal disclaimer.

(21) Appl. No.: 16/817,159

(22) Filed: Mar. 12, 2020

(65) Prior Publication Data

US 2020/0213540 A1 Jul. 2, 2020

Related U.S. Application Data

(63) Continuation of application No. PCT/JP2018/029870, filed on Aug. 9, 2018.

(30) Foreign Application Priority Data

Sep. 14, 2017 (JP) .............................. JP2017-176994

(51) Int. Cl.
*H04N 5/3745* (2011.01)
*G01S 17/894* (2020.01)
(Continued)

(52) U.S. Cl.
CPC ......... *H04N 5/37452* (2013.01); *G01S 7/484* (2013.01); *G01S 7/4863* (2013.01);
(Continued)

(58) Field of Classification Search
CPC ........ G01S 17/10; G01S 7/484; G01S 7/4863; G01S 7/4865; G01S 17/894;
(Continued)

(56) References Cited

U.S. PATENT DOCUMENTS 6,188,093 B1 * 2/2001 Isogai ............... H01L 27/14643
257/292
7,843,029 B2 * 11/2010 Kawahito ............. G01S 7/4816
257/461

(Continued)

FOREIGN PATENT DOCUMENTS

JP 2015-215181 A 12/2015

OTHER PUBLICATIONS

International Search Report and Written Opinion dated Nov. 6, 2018 in International Application No. PCT/JP2018/029870; with partial English translation.

*Primary Examiner* — Christopher S Kelley
*Assistant Examiner* — Asmamaw G Tarko
(74) *Attorney, Agent, or Firm* — McDermott Will & Emery LLP

(57) ABSTRACT

A solid-state imaging device includes: a plurality of pixels arranged in a matrix on a semiconductor substrate, wherein each of the plurality of pixels includes: a photoelectric converter that converts received light into a signal charge; a plurality of read gates that each read the signal charge from the photoelectric converter; a plurality of charge accumulators that each accumulate the signal charge read by any one of the plurality of read gates; and a charge holder that receives, from one of the plurality of charge accumulators, transfer of the signal charge accumulated in the charge accumulator, holds the signal charge, and transfers, to one of the plurality of charge accumulators, the signal charge held.

12 Claims, 13 Drawing Sheets

(51) Int. Cl.
  *G01S 7/4863* (2020.01)
  *G01S 7/486* (2020.01)
  *H04N 5/33* (2006.01)
  *H04N 5/353* (2011.01)
  *H04N 5/378* (2011.01)
  *G01S 7/484* (2006.01)
  *H01L 27/146* (2006.01)
  *G01S 17/10* (2020.01)
  *G01S 7/4865* (2020.01)

(52) U.S. Cl.
  CPC .......... *G01S 7/4865* (2013.01); *G01S 7/4868* (2013.01); *G01S 17/10* (2013.01); *G01S 17/894* (2020.01); *H01L 27/146* (2013.01); *H01L 27/14643* (2013.01); *H04N 5/33* (2013.01); *H04N 5/353* (2013.01); *H04N 5/378* (2013.01)

(58) Field of Classification Search
  CPC .... H01L 27/14825; H04N 5/33; H04N 5/353; H04N 5/3592; H04N 5/3745; H04N 5/37452; H04N 5/378
  USPC .................................................... 348/302, 135
  See application file for complete search history.

(56) References Cited

U.S. PATENT DOCUMENTS

| | | | | |
|---|---|---|---|---|
| 8,179,463 | B1* | 5/2012 | Geurts | H04N 5/37452 348/296 |
| 8,570,412 | B2* | 10/2013 | Yanagita | H01L 27/14609 348/301 |
| 10,228,463 | B2* | 3/2019 | Mase | G01S 7/4863 |
| 2002/0101532 | A1* | 8/2002 | Takayama | H04N 5/353 348/362 |
| 2005/0236553 | A1* | 10/2005 | Noto | H01L 27/14625 257/E31.128 |
| 2006/0192938 | A1* | 8/2006 | Kawahito | H01L 31/101 356/5.03 |
| 2007/0216957 | A1* | 9/2007 | Kamon | H04N 5/2352 358/296 |
| 2008/0122933 | A1* | 5/2008 | Murayama | H04N 5/332 348/164 |
| 2009/0057673 | A1* | 3/2009 | Ichikawa | H01L 27/14603 257/59 |
| 2010/0231774 | A1* | 9/2010 | Tashiro | H04N 5/378 348/311 |
| 2011/0037969 | A1* | 2/2011 | Spickermann | G01S 7/4863 356/5.01 |
| 2011/0273561 | A1* | 11/2011 | Oggier | H04N 5/37452 348/135 |
| 2011/0290985 | A1* | 12/2011 | Kume | H01L 27/14609 250/208.1 |
| 2011/0317878 | A1* | 12/2011 | Kang | G01S 17/10 382/106 |
| 2012/0248514 | A1* | 10/2012 | Korekado | H01L 27/14831 257/292 |
| 2013/0021441 | A1* | 1/2013 | Kim | H04N 5/3745 348/46 |
| 2015/0092019 | A1* | 4/2015 | Asano | H04N 5/35572 348/46 |
| 2015/0341573 | A1* | 11/2015 | Matsuo | G01S 7/4863 348/135 |
| 2016/0219237 | A1* | 7/2016 | Kobayashi | H04N 5/378 |
| 2016/0259057 | A1* | 9/2016 | Ito | H04N 9/04559 |
| 2016/0344967 | A1* | 11/2016 | Barnes | G01S 17/894 |
| 2017/0045618 | A1* | 2/2017 | Mase | H01L 31/12 |
| 2017/0187968 | A1* | 6/2017 | Kobayashi | H04N 5/3745 |
| 2018/0156898 | A1* | 6/2018 | Suzuki | G01S 7/4865 |
| 2019/0280025 | A1* | 9/2019 | Sakakibara | H03M 1/08 |

* cited by examiner

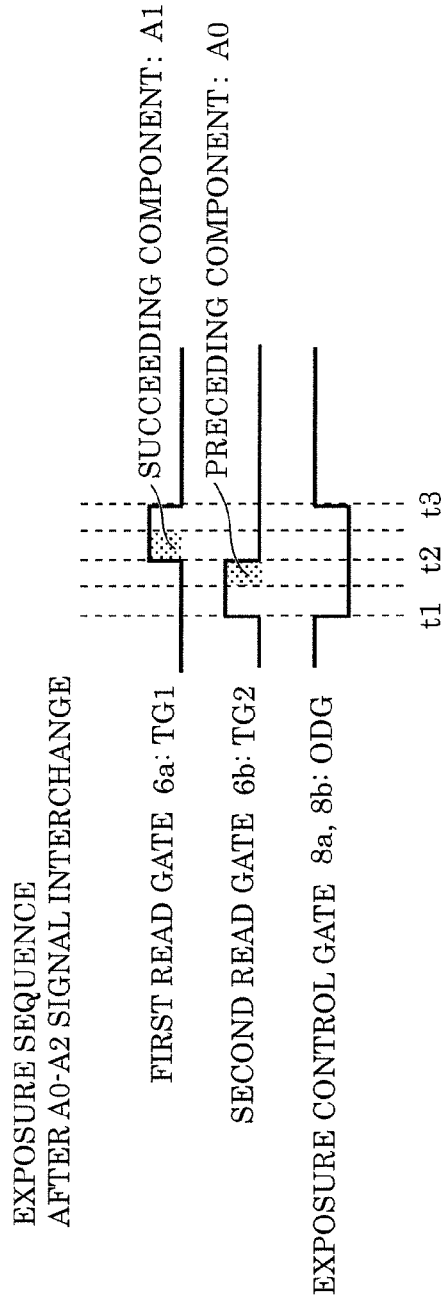

SOLID-STATE IMAGING DEVICE AND IMAGING APPARATUS INCLUDING SAME

CROSS REFERENCE TO RELATED APPLICATIONS

This application is a U.S. continuation application of PCT International Patent Application Number PCT/JP2018/029870 filed on Aug. 9, 2018, claiming the benefit of priority of Japanese Patent Application Number 2017-176994 filed on Sep. 14, 2017, the entire contents of which are hereby incorporated by reference.

BACKGROUND

1. Technical Field

The present disclosure relates to a solid-state imaging device that obtains a distance image of a subject.

2. Description of the Related Art

Solid-state imaging devices that obtain distance images of subjects using a time of flight (TOF) method are conventionally known (for example, see Japanese Unexamined Patent Application Publication No. 2015-215181).

SUMMARY

With conventional solid-state imaging devices, motion blur may occur when obtaining a distance image of a moving subject.

The present disclosure therefore has an object of providing a solid-state imaging device that can suppress motion blur when obtaining a distance image of a subject as compared with conventional techniques, and an imaging apparatus including the same.

A solid-state imaging device according to an aspect of the present disclosure is a solid-state imaging device including: a plurality of pixels arranged in a matrix on a semiconductor substrate, wherein each of the plurality of pixels includes: a photoelectric converter that converts received light into a signal charge; a plurality of read gates that each read the signal charge from the photoelectric converter; a plurality of charge accumulators that each accumulate the signal charge read by any one of the plurality of read gates; and a charge holder that receives, from one of the plurality of charge accumulators, transfer of the signal charge accumulated in the charge accumulator, holds the signal charge, and transfers, to one of the plurality of charge accumulators, the signal charge held.

An imaging apparatus according to an aspect of the present disclosure includes: the solid-state imaging device described above; a light source that emits infrared light in a pulse form at a plurality of timings, in each exposure period in one frame period; and a processor that generates a distance image based on an output signal of the solid-state imaging device.

The above-described solid-state imaging device and imaging apparatus can suppress motion blur when obtaining a distance image of a subject as compared with conventional techniques.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3B is a drive timing chart illustrating operation of the solid-state imaging device according to Embodiment 1 during exposure;

DETAILED DESCRIPTION OF THE EMBODIMENTS

Circumstances Leading to Attainment of One Aspect of the Present Disclosure

Of a plurality of methods for detecting the distance to an object, a TOF method that measures a distance using a time of flight during which light travels to and from a measurement object is known.

Figure 10:
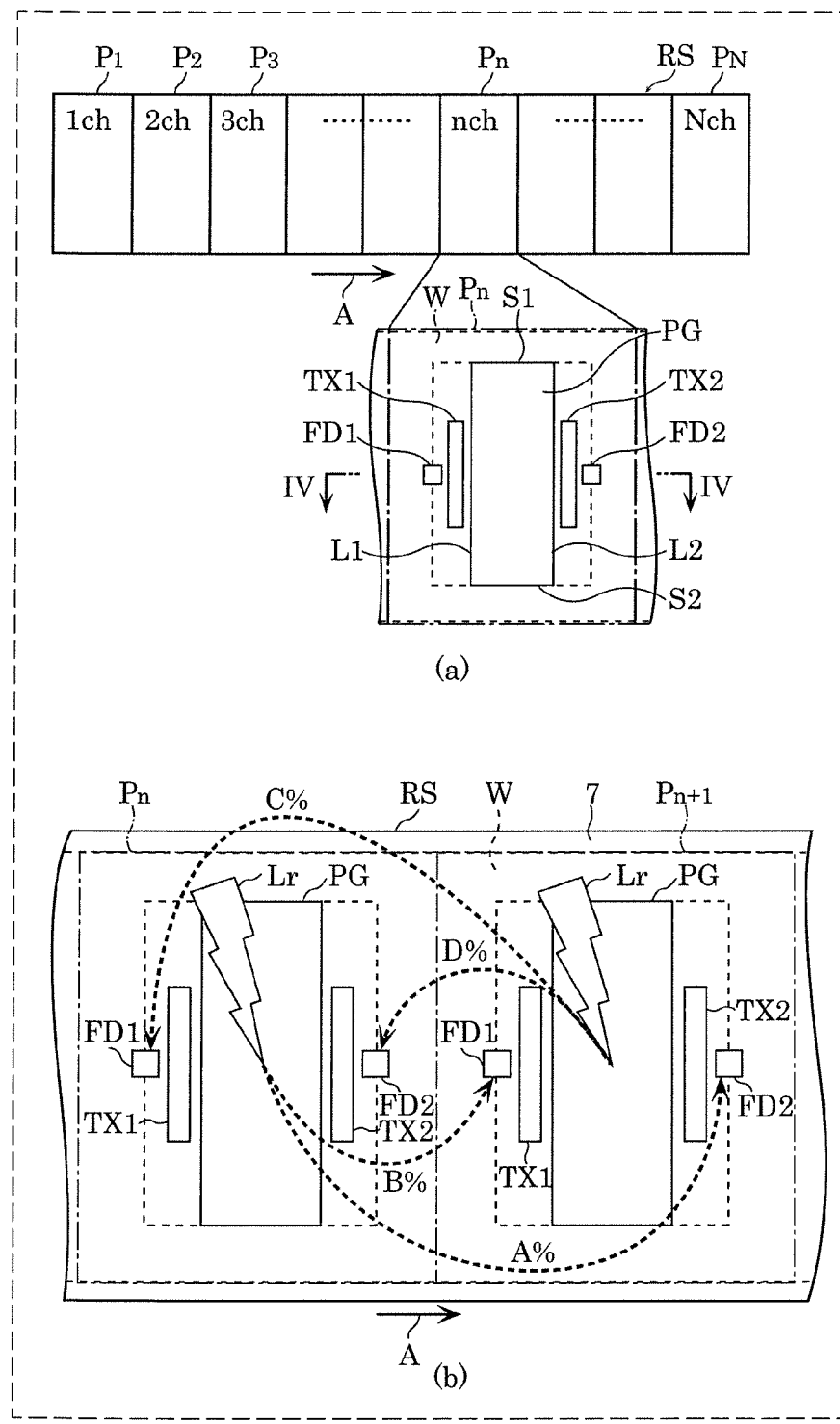
FIG. 10 is a plan diagram of a pixel in a conventional distance measuring apparatus.
Figure 11:
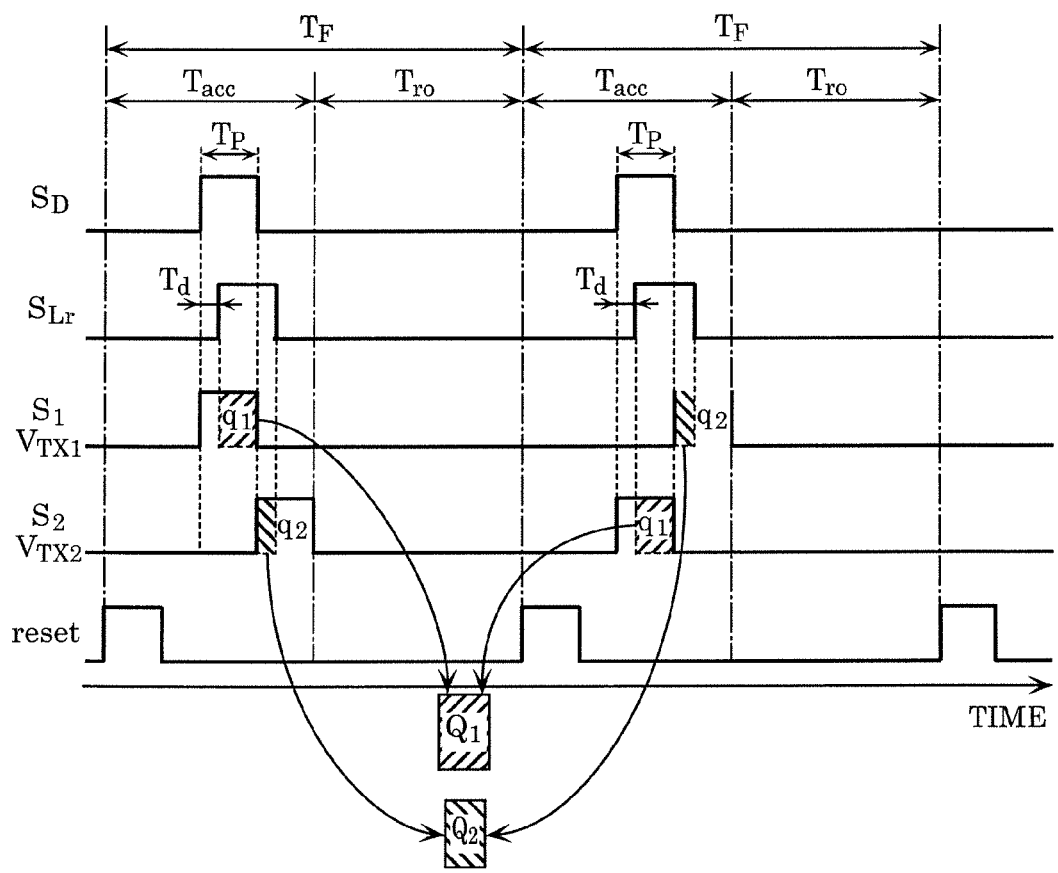
FIG. 11 is a timing chart of each signal in the conventional distance measuring apparatus.

FIGS. 10 and 11 illustrate a conventional distance measuring apparatus disclosed in Japanese Unexamined Patent Application Publication No. 2015-215181.

FIG. 10 is a pixel plan diagram of the conventional technique. FD1 and FD2 are first and second charge accumulation regions, TX1 and TX2 are first and second transfer electrodes, and PG is a photo-gate electrode.

FIG. 11 is a timing chart of each signal in the conventional distance measuring apparatus. Of a plurality of frame cycles $T_F$, two frame cycles $T_F$ successive in chronological order are illustrated. $S_D$ is a light source drive signal, $S_{Lr}$ is a reflected light intensity signal when pulse light reflected at an object returns to an imaging region, S1 is first pulse signal S1 applied to first transfer electrode TX1, S2 is second pulse signal S2 applied to second transfer electrode TX2, reset is a reset signal, $T_{acc}$ is an accumulation period, and $T_{ro}$ is a read period.

The conventional technique described in Japanese Unexamined Patent Application Publication No. 2015-215181 suppresses differences in leakage (crosstalk) of charges from neighboring pixels as illustrated in (b) in FIG. 10, by interchanging timings of pulses applied to read gates between frames and using, for distance calculation, two signals Q1 and Q2 obtained by adding signals for two frames as illustrated in FIG. 11.

With the conventional technique, however, there is a time difference in exposure period between frames, because the read timings are changed between the frames. Hence, motion blur tends to occur. Two frames need to be read in order to obtain added distance signals. This causes a decrease in effective frame rate, and requires frame memory outside.

Moreover, the conventional technique fails to take into account background light components and dark current components, and accordingly has significant distance measuring errors in environments in which such signals not including distance information are not negligible.

In view of the above, the inventors conducted repeatedly study, and conceived a solid-state imaging device that achieves high distance measuring accuracy without motion blur and a considerable decrease in frame rate.

Embodiments of the present disclosure will be described below, with reference to the drawings. Although the attached drawings are referred to in the description, they are provided for illustrative purposes, and do not limit the present disclosure. Elements indicating substantially same structures, operations, and effects in the drawings are given the same reference marks.

Embodiment 1

Figure 1:
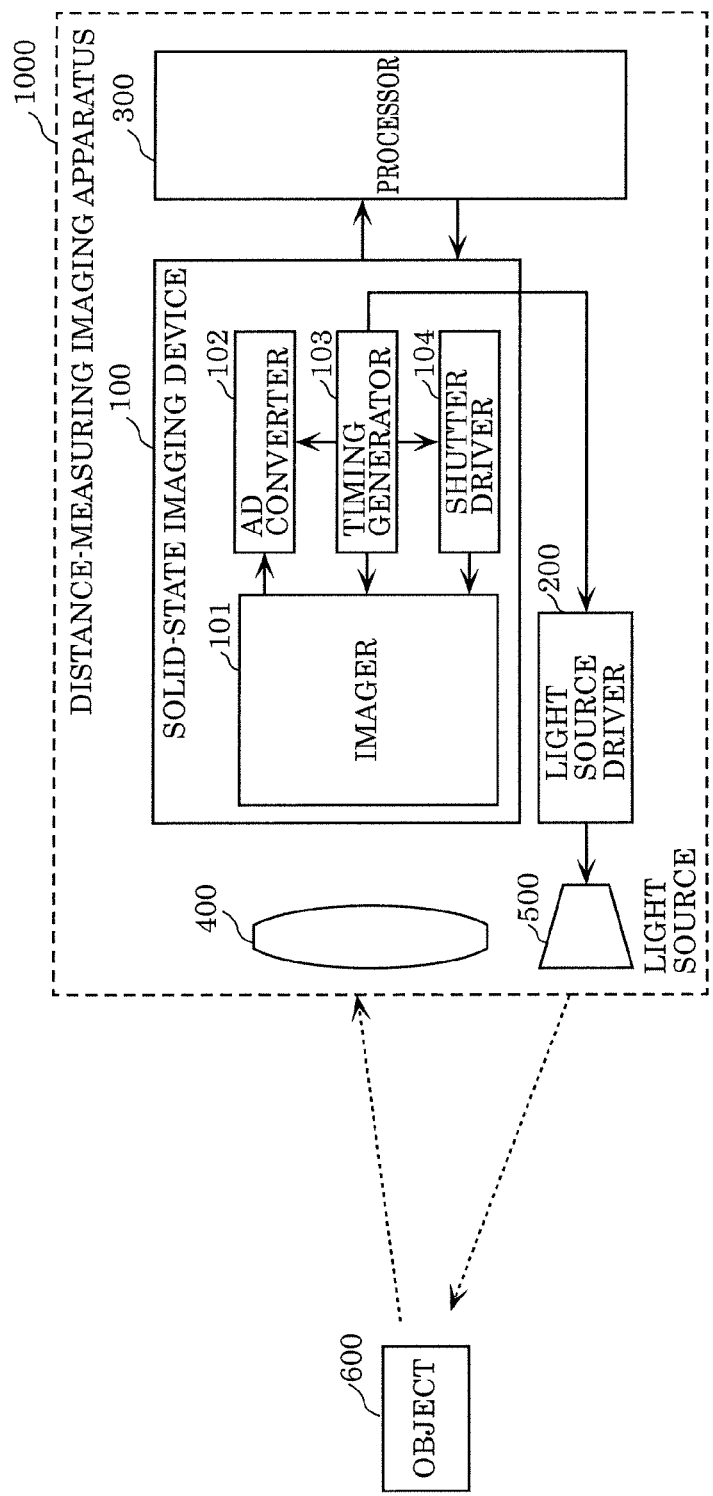
FIG. 1 is a functional block diagram illustrating an example of a schematic structure of a distance-measuring imaging apparatus (imaging apparatus) according to Embodiment 1.

FIG. 1 is a functional block diagram illustrating an example of a schematic structure of distance-measuring imaging apparatus 1000 according to Embodiment 1 of the present disclosure. As illustrated in the drawing, distance-measuring imaging apparatus 1000 includes solid-state imaging device 100, light source driver 200, processor 300, optical lens 400, and light source 500. Solid-state imaging device 100 includes imager 101, AD converter 102, timing generator 103, and shutter driver 104.

Timing generator 103 generates a light emission signal instructing light source 500 to irradiate object 600 with light (e.g. near-infrared light) and drives light source 500 via light source driver 200, and generates an exposure signal instructing imager 101 to perform exposure to reflected light from object 600.

Imager 101 includes a plurality of pixels arranged in a matrix on a semiconductor substrate. Imager 101 performs, for a region including object 600, exposure a plurality of times in one frame period according to timing indicated by the exposure signal generated by timing generator 103, and obtains a signal corresponding to the total sum of the exposure amounts of the exposure performed the plurality of times.

Processor 300 calculates the distance to object 600, based on a signal received from solid-state imaging device 100.

As illustrated in FIG. 1, object 600 is irradiated with near-infrared light from light source 500 in the presence of background light. Reflected light from object 600 is incident on imager 101 through optical lens 400. The reflected light incident on imager 101 forms an image, and the formed image is converted into an electrical signal. Operations of light source 500 and solid-state imaging device 100 are controlled by timing generator 103 in solid-state imaging device 100. An output of solid-state imaging device 100 is converted into a distance image by processor 300, and converted into a visible image depending on the purpose. Processor 300 does not necessarily need to be provided outside solid-state imaging device 100, and solid-state imaging device 100 may include all or part of functions of distance calculation and the like.

Solid-state imaging device 100 is, for example, a CMOS image sensor.

In a typical pulse TOF method, a first exposure period starting from a rise time of irradiation light with pulse width Tp is denoted by T1, a second exposure period starting from a fall time of the irradiation light is denoted by T2, and exposure periods T1 and T2 are set to the same length as pulse width Tp. When the signal amount obtained by imager 101 in first exposure period T1 is denoted by A0, the signal amount obtained by the camera in second exposure period T2 is denoted by A1, and the light speed (299,792,458 m/s) is denoted by c, distance d is given by the following formula.

$$d = c \times Tp/2 \times A1/(A0+A1).$$

A solid-state imaging device used in a distance measuring camera of the TOF method performs sampling for one cycle of irradiation light, a plurality of times.

$D = c \times Tp/2$, where D denotes a distance measuring range.

In a TOF method (pulse TOF method, distance measuring method) used in Embodiment 2, background light components and dark current components are taken into account. A first exposure period starting from a rise time of irradiation light with pulse width Tp of a light emission pulse is denoted by T1, a second exposure period starting from a fall time of the irradiation light is denoted by T2, the signal amount obtained by the camera in first exposure period T1 is denoted by A0, the signal amount obtained by the camera in second exposure period T2 is denoted by A1, and the light speed (299,792,458 m/s) is denoted by c. In an environment in which a signal contains a background light component from a light source (e.g. the sun) other than irradiation light or a dark current component of a charge accumulator, a third exposure period in which the near-infrared light source is off, denoted by T3, is set to the same length as pulse width $T_p$, and the signal amount obtained in third exposure period T3 is calculated as A2. When calculating distance d, A2 is subtracted in order to extract only distance information from each of A0 and A1. That is, $$d = c \times Tp/2 \times \{(A1-A2)/(A0-A2+A1-A2)\}.$$

As a pixel structure of solid-state imaging device 100, there is a method of allocating signal charges generated by a photoelectric converter to charge accumulators by a plurality of read gates.

Examples of charge accumulators include floating diffusion layers and charge coupled device memories (CCD memories). In a structure using a plurality of read gates, differences in read characteristics are caused by variations in the manufacturing process, bias of condensed light to a specific read gate, and the like. Moreover, crosstalk between pixels may occur, causing distance measuring errors.

Figure 2:
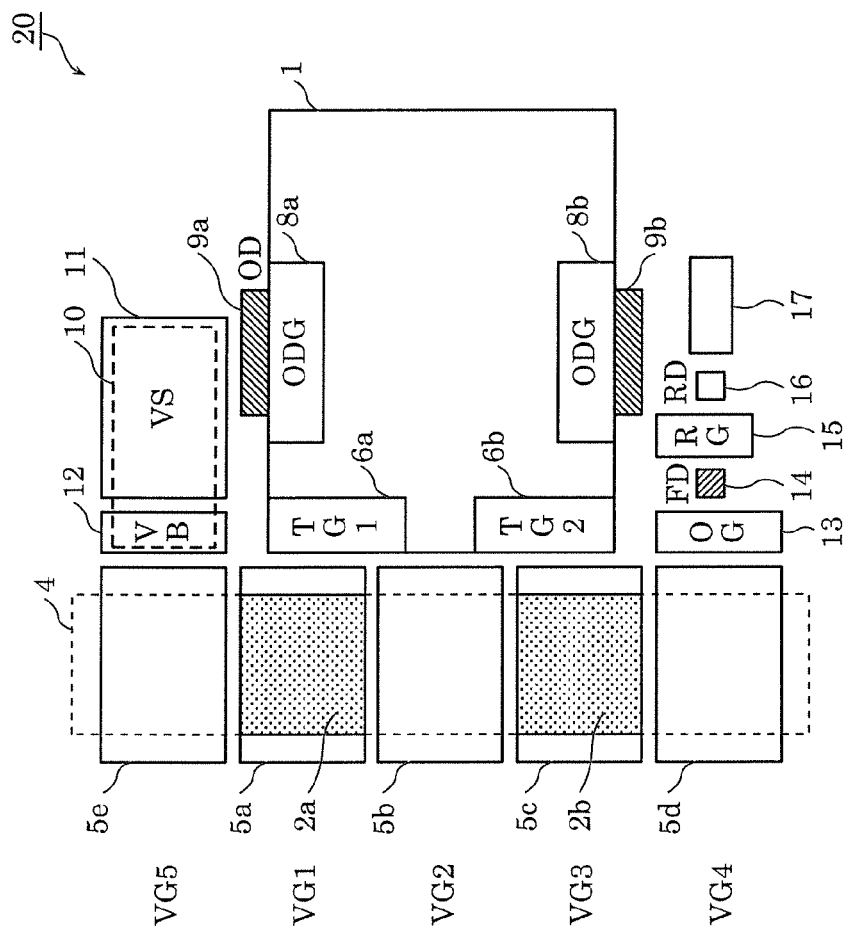
FIG. 2 is a schematic plan diagram illustrating a layout structure of a pixel included in a solid-state imaging device according to Embodiment 1.

FIG. 2 is a schematic plan diagram illustrating a layout structure of pixel 20 included in solid-state imaging device 100 according to Embodiment 1.

A plurality of pixels 20 are arranged in a matrix in a pixel region of the semiconductor substrate. Each pixel 20 includes photoelectric converter 1, a plurality of charge accumulators 2 (e.g. first charge accumulator 2a and second charge accumulator 2b), a plurality of read gates 6 (e.g. first read gate 6a and second read gate 6b), output control gate 13, floating diffusion layer 14, reset gate 15, reset drain 16, read circuit 17, a plurality of exposure control gates 8 (e.g. exposure control gates 8a and 8b), a plurality of overflow drains 9 (e.g. overflow drains 9a and 9b), and charge holder 10.

Photoelectric converter 1 converts received light into a signal charge.

Read gate 6 reads the signal charge from photoelectric converter 1.

Charge accumulator 2 accumulates the signal charge read by read gate 6.

Charge accumulator 2 is composed of transfer channel (CCD channel) 4 located under a gate insulator and for transferring a signal charge, and transfer electrode 5 (e.g. any of transfer electrodes 5a, 5b, 5c, 5d, and 5e) located above the gate insulator. In detail, charge accumulator 2 includes a part of transfer channel 4 and a part of transfer electrode 5 that overlaps with the part of transfer channel 4 in a planar view of the semiconductor substrate, as illustrated in FIG. 2. The number of transfer channels 4 per one pixel is one, as illustrated in FIG. 2.

Voltages applied to transfer electrodes 5a, 5b, 5c, 5d, and 5e are hereafter denoted by VG1, VG2, VG3, VG4, and VG5, respectively.

First charge accumulator 2a and second charge accumulator 2b perform 5-phase drive. For example, first charge accumulator 2a and second charge accumulator 2b are formed adjacent to first read gate 6a and second read gate 6b respectively, under transfer electrodes 5 (under transfer electrodes 5a and 5c in this example) to which VG1 and VG3 that are high voltage during exposure are applied.

Overflow drain 9 discharges at least a part of the signal charge from photoelectric converter 1.

Exposure control gate 8 controls the discharge to overflow drain 9.

Charge holder 10 receives, from one of the plurality of charge accumulators 2 (first charge accumulator 2a and second charge accumulator 2b in this example), transfer of a signal charge accumulated in charge accumulator 2 and holds the signal charge, and transfers the held signal charge to one of the plurality of charge accumulators 2 (first charge accumulator 2a and second charge accumulator 2b in this example). As illustrated in FIG. 2, charge holder 10 includes charge holding gate 11 and transfer control gate 12 that performs transfer control of charge holder 10.

Floating diffusion layer 14 receives, from one of the plurality of charge accumulators 2 (first charge accumulator 2a and second charge accumulator 2b in this example), transfer of a signal charge accumulated in charge accumulator 2, and holds the signal charge.

Output control gate 13 controls transfer to floating diffusion layer 14.

Read circuit 17 converts the signal charge held in floating diffusion layer 14 into a voltage, and reads it out of pixel 20. For example, read circuit 17 includes a source follower transistor having a gate connected to floating diffusion layer 14, and a selection transistor connected in series to the source follower transistor. For example, as a result of the selection transistor selecting read circuit 17, the signal charge held in floating diffusion layer 14 is read out to AD converter 102 by read circuit 17.

First read gate 6a and second read gate 6b are vertically symmetric with respect to a center line dividing photoelectric converter 1 in the vertical direction (the column direction of the plurality of pixels 20 arranged in a matrix, i.e. the up-down direction in FIG. 2). In the plurality of pixels 20, a signal charge is read from photoelectric converter 1 by first read gate 6a and second read gate 6b in the same direction (i.e. leftward in FIG. 2) in the row direction in the matrix arrangement of the plurality of pixels 20, as illustrated in FIG. 2.

Likewise, exposure control gates 8a and 8b are vertically symmetric with respect to the center line dividing photoelectric converter 1 in the vertical direction (the column direction of the plurality of pixels 20 arranged in a matrix, i.e. the up-down direction in FIG. 2).

The vertically symmetric positional relationship between first read gate 6a and second read gate 6b and the vertically symmetric positional relationship between exposure control gates 8a and 8b are intended to match by design the characteristics of reading performed using two pairs of read gate 6 and exposure control gate 8.

Figure 3A:
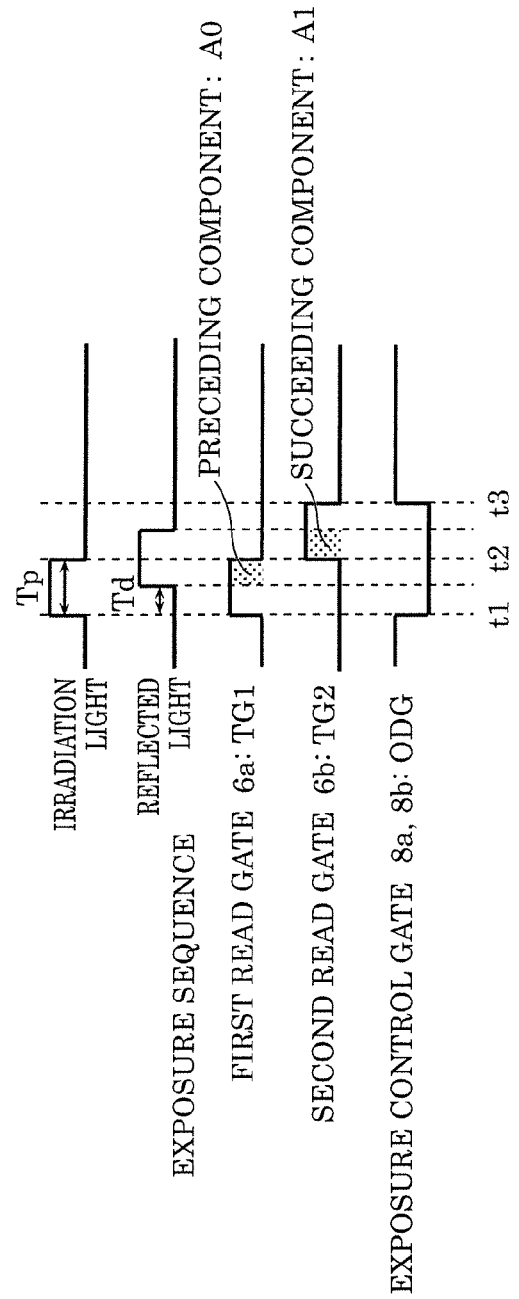
FIG. 3A is a drive timing chart illustrating operation of the solid-state imaging device according to Embodiment 1 during exposure.

FIGS. 3A and 3B are each a drive timing chart illustrating operation of the solid-state imaging device according to Embodiment 1 during exposure.

Operation during exposure will be described below, with reference to FIG. 3A.

Drive pulse ODG is applied to each of exposure control gates 8a and 8b, and drive pulses TG1 and TG2 are applied respectively to first read gate 6a and second read gate 6b. Drive pulses VG1 to VG5 are applied respectively to transfer electrodes 5a to 5e, although not illustrated in FIG. 3A. During exposure, high voltage is applied to VG1 and VG3, and low voltage is applied to the other transfer electrodes. Charge accumulation under each transfer electrode 5 to which high voltage is applied is possible. In detail, each transfer electrode 5 (transfer electrodes 5a and 5c in this example) to which high voltage is applied and transfer channel 4 overlapping with transfer electrode 5 from below form charge accumulator 2 (first charge accumulator 2a and second charge accumulator 2b in this example). Light source 500 repeatedly applies near-infrared pulse light that alternates between on and off in a constant cycle. Tp denotes the pulse width of the irradiation pulse light. The near-infrared pulse light reflected from the object reaches imager 101 with delay Td depending on the distance from light source 500, and is converted into a signal charge in photoelectric converter 1.

In an initial state, ODG is in high state, and photoelectric converter 1 is in reset state. Moreover, first read gate 6a and second read gate 6b are in low state, and first charge accumulator 2a and second charge accumulator 2b in which transfer electrodes 5a and 5c are held in high state and photoelectric converter 1 are electrically disconnected. In this state, the signal charge generated in photoelectric converter 1 is discharged to overflow drain 9 via exposure control gate 8, without being accumulated in photoelectric converter 1.

Next, at time t1 at which the irradiation pulse light is turned on, ODG is driven to low state, and the discharge of the charge from photoelectric converter 1 to overflow drain 9 is stopped. At this time, first read gate 6a transitions from low state to high state. The transfer of the signal charge generated as a result of the incidence of the reflected pulse light to first charge accumulator 2a via first read gate 6a is started, and a preceding component (A0) of the reflected pulse light is held in first charge accumulator 2a.

Next, second read gate 6b transitions from low state to high state. The transfer of the signal charge generated as a result of the incidence of the reflected pulse light to second charge accumulator 2b via second read gate 6b is started, and a succeeding component (A1) of the reflected pulse light is held in second charge accumulator 2b.

Thus, first read gate 6a and second read gate 6b respectively read a first signal charge (the preceding component (A0) of the reflected pulse light) and a second signal charge (the succeeding component (A1) of the reflected pulse light) with a first phase difference, in the exposure period in one frame period.

With the foregoing conventional technique, the pulse timings of TG1 and TG2 are interchanged for each frame. In Embodiment 1, pixel 20 includes charge holder 10. Hence, by interchanging distance-measuring signals A0 and A1 in position during exposure and, after the interchange, interchanging pulses TG1 and TG2, differences in characteristics depending on the read position and the position of charge accumulator 2 can be suppressed in one frame.

The operation will be described below.

Figure 4:
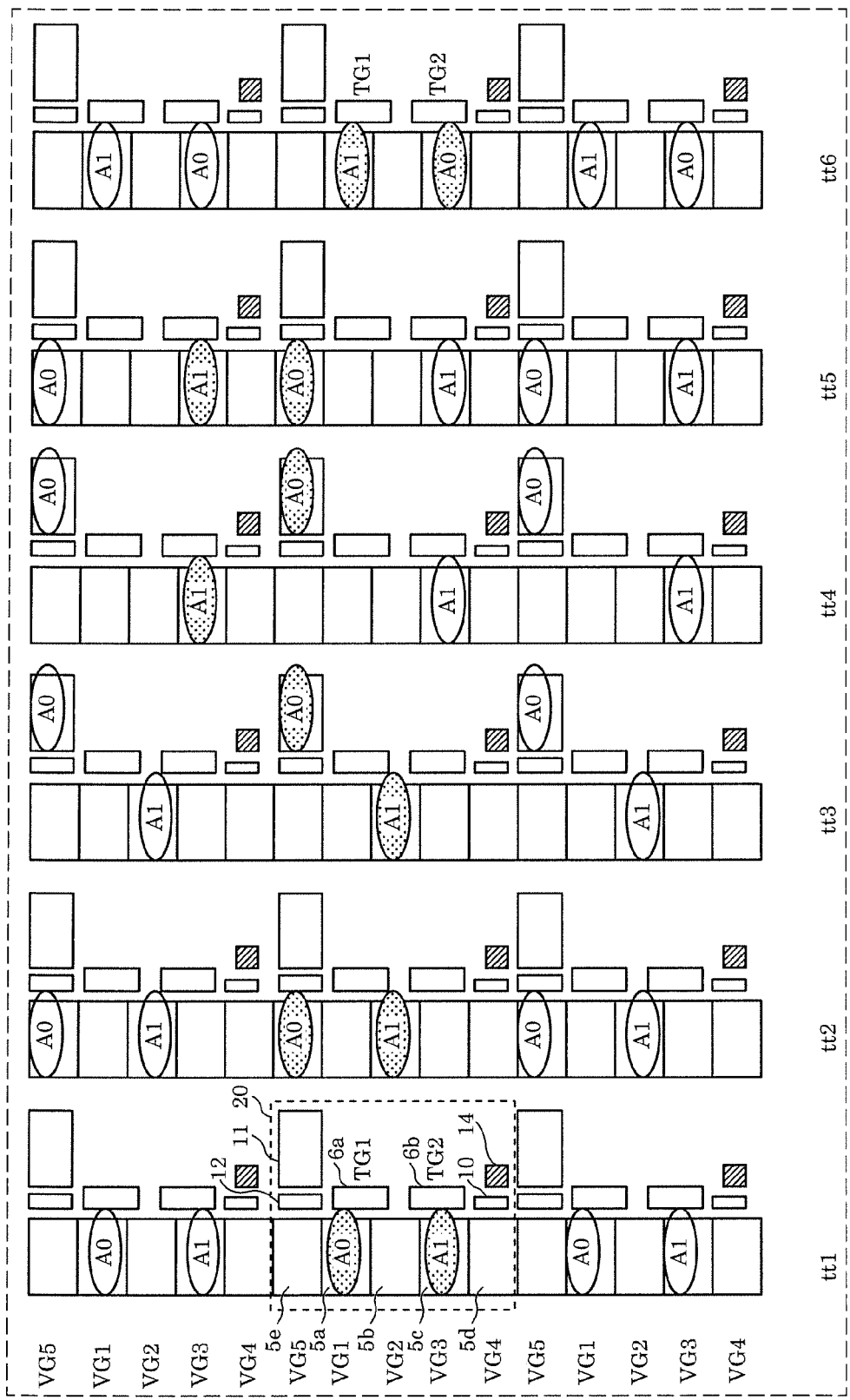
FIG. 4 is a schematic plan diagram illustrating signal interchange operation of the solid-state imaging device according to Embodiment 1.

FIG. 4 is a schematic plan diagram illustrating signal interchange operation of solid-state imaging device 100 according to Embodiment 1.

Figure 5:
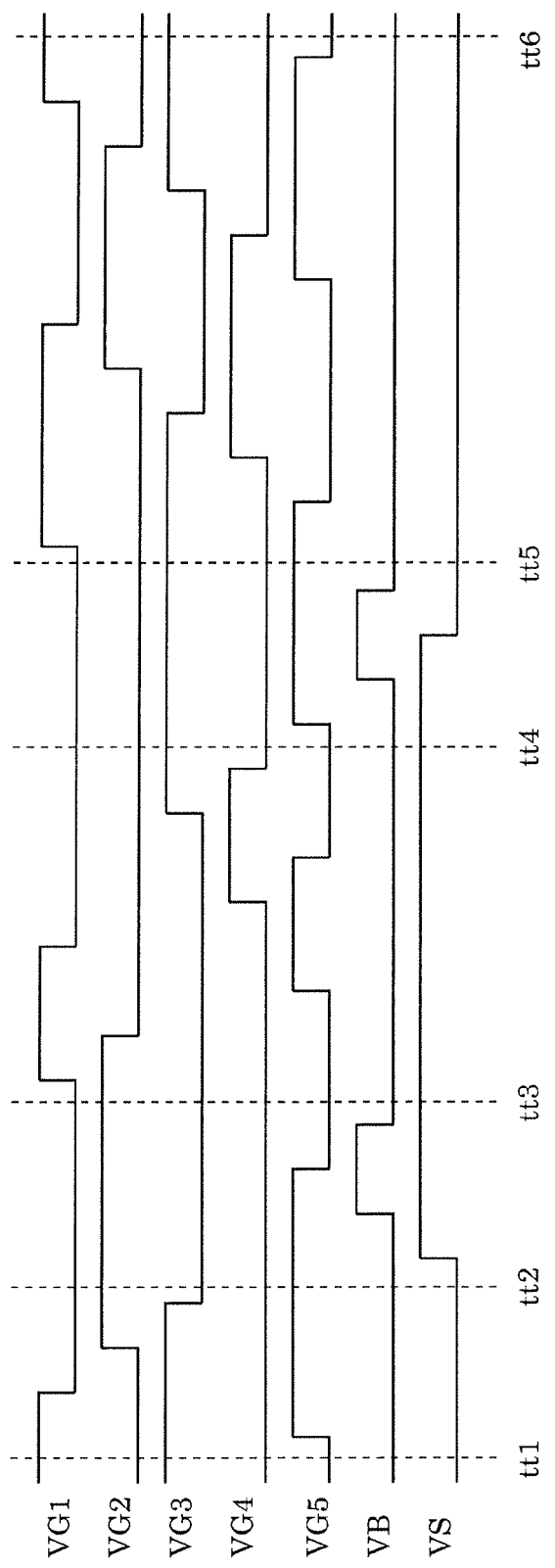
FIG. 5 is a drive timing chart illustrating signal interchange operation of the solid-state imaging device according to Embodiment 1.

FIG. 5 is a drive timing chart illustrating signal interchange operation of solid-state imaging device 100 according to Embodiment 1.

In FIG. 4, drive pulses VG1 to VG5 are applied to respective transfer electrodes 5, to transfer a signal charge to a desired location. Drive pulse VS is applied to charge holding gate 11, and drive pulse VB is applied to transfer control gate 12. To clearly indicate signal positions, only for signals A0 and A1 generated in center pixel 20 in each column, the background of the characters is filled with dots. Here, drive pulses VG1 to VG5 applied to transfer electrodes 5a to 5e, drive pulse VS applied to charge holding gate 11, and drive pulse VB applied to transfer control gate 12 are output from timing generator 103.

tt1 is a timing (i.e. t3) at which the exposure illustrated in FIG. 3A ends, and signals A0 and A1 are accumulated under respective transfer electrodes 5 to which VG1 and VG3 driven to high voltage are applied. After this, the charges are transferred by 5-phase drive in the upward direction in FIG. 4.

Next, at tt2, VG2 and VG5 are driven to high voltage, and signal charges are accumulated under respective transfer electrodes 5 to which VG2 and VG5 are applied. Following this, VS is driven to high voltage and then VB is driven to high voltage as illustrated in FIG. 5, to form a charge transfer path between charge accumulator 2 of transfer electrode 5 to which VG5 is applied and charge holder 10. After this, low voltage is applied sequentially to transfer electrode 5 and transfer control gate 12 to which VG5 and VB are applied, to transfer signal A0 to under charge holding gate 11 (tt3 in FIGS. 4 and 5). Timing generator 103 thus outputs a first signal for transferring, from one of the plurality of charge accumulators 2, the signal charge accumulated in charge accumulator 2 to charge holder 10.

Next, signal A1 located below signal A0 under charge holding gate 11 at tt3 is transferred upward by 5-phase drive over charge holding gate 11, and accumulated under transfer electrode 5 to which VG3 is applied (tt4).

Subsequently, VG5 and VB are driven to high voltage again, to form a transfer path between charge holder 10 and charge accumulator 2 of transfer electrode 5 to which VG5 is applied. After this, low voltage is applied in the order of VS and VB, to transfer signal A0 to under transfer electrode 5 to which VG5 that is high voltage is applied (tt5). Timing generator 103 thus generates a second signal for transferring, from charge holder 10, the held signal charge to one of the plurality of charge accumulators 2.

Next, transfer is performed by 5-phase drive in the downward direction, to create a state in which A0 and A1 are interchanged in vertical position (tt6). This series of operation is hereafter referred to as "interchange operation". Thus, by outputting a plurality of signals including the first signal and the second signal, timing generator 103 interchanges the position of first charge accumulator 2a that accumulates the first signal charge (A0) and the position of second charge accumulator 2b that accumulates the second signal charge (A1) in the case where the first signal charge (A0) is read by first read gate 6a and the second signal charge (A1) is read by second read gate 6b.

After this interchange operation, signal A1 is located beside first read gate 6a to which TG1 is applied, and signal A0 is located beside second read gate 6b to which TG2 is applied, as illustrated in FIG. 4. Accordingly, the pulse timings of pulses applied to TG1 and TG2 can be interchanged to start exposure again, as illustrated in FIG. 3B. In detail, after the interchange operation described above, first read gate 6a and second read gate 6b can respectively read a signal charge to second charge accumulator 2b and a signal charge to first charge accumulator 2a with a second phase difference that differs by 180 degrees in phase in phase from the first phase difference, in the exposure period. Herein, the expression "different by 180 degrees in phase" means that the phase relationship between the drive pulse applied to TG1 and the drive pulse applied to TG2 in FIG. 3A and the phase relationship between the drive pulse applied to TG1 and the drive pulse applied to TG2 in FIG. 3B have opposite-phase timings.

In the exposure before the interchange, $A0=A0(TG1)$ $A1=A1(TG2)$ where (TG1) and (TG2) respectively denote that the signals are read by first read gate 6a and second read gate 6b to which TG1 and TG2 are applied.

In the exposure after the interchange, $A0=A0(TG2)$ $A1=A1(TG1)$.

Addition of each of A0 and A1 yields $A0=A0(TG1)+A0(TG2)$ $A1=A1(TG1)+A1(TG2)$.

Each of A0 and A1 evenly includes the components read by first read gate 6a and second read gate 6b to which TG1 and TG2 are applied, and also the charge accumulation positions are evenly separated. Therefore, even in the case where two read gates 6 and charge accumulators 2 are provided, signal differences due to differences in read location and charge accumulation position in the exposure period in one frame can be canceled out.

Figure 6:
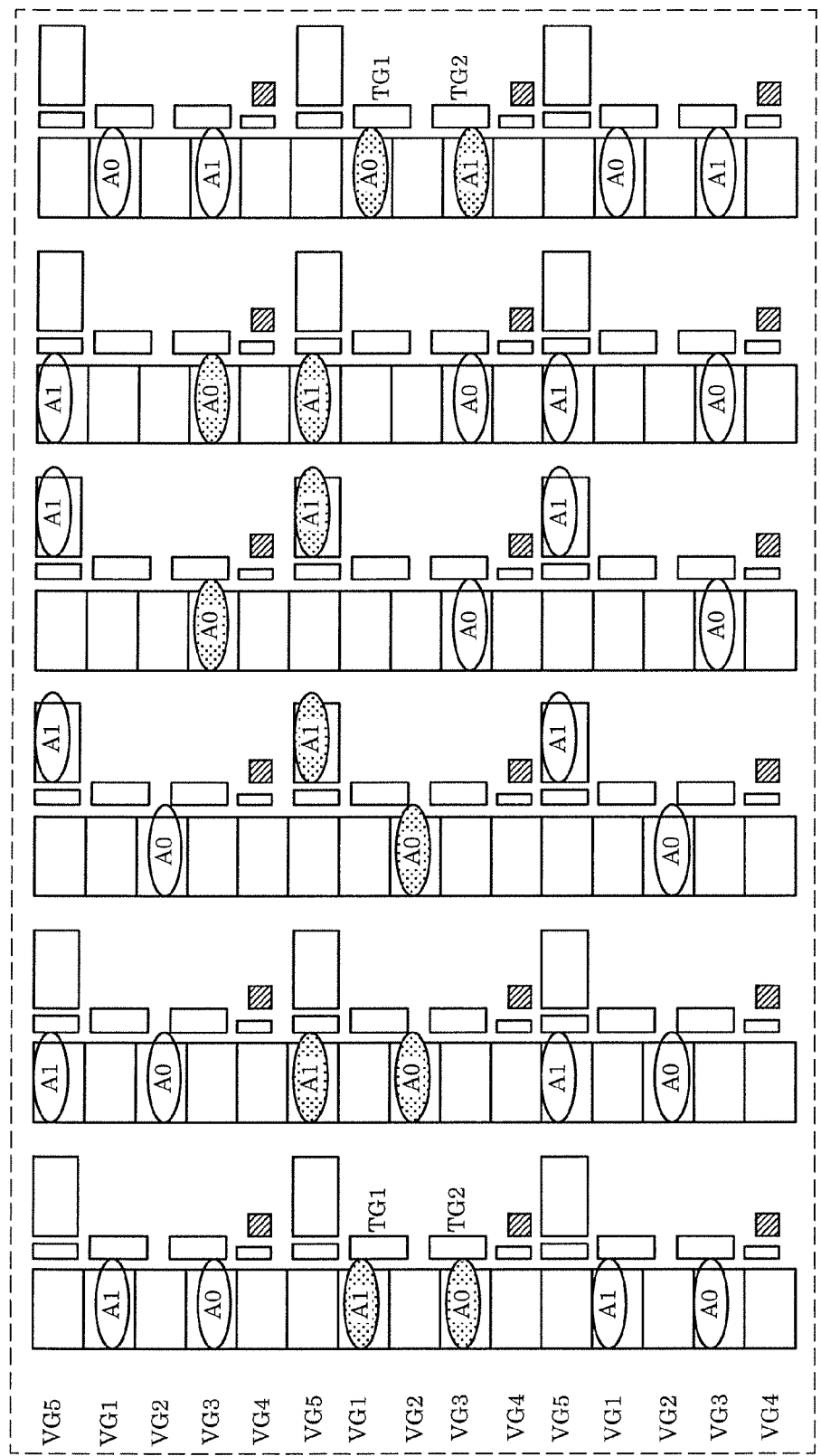
FIG. 6 is a schematic plan diagram illustrating signal interchange operation of the solid-state imaging device according to Embodiment 1.

FIG. 6 is a schematic plan diagram illustrating signal interchange operation of solid-state imaging device 100 according to Embodiment 1.

Performing the interchange operation illustrated in FIG. 6 following the exposure after the interchange operation illustrated in FIG. 4 enables return to the initial state (tt1) in FIG. 4. It is desirable to reduce bias in signal in the time axis by repeatedly performing the exposure in FIG. 3A, the interchange operation in FIG. 4, the exposure in FIG. 3B, and the interchange operation in FIG. 6 a plurality of times.

As described in detail above, according to Embodiment 1, differences in characteristics due to the positions of read gates 6 and charge accumulators 2 can be suppressed without using a plurality of frames, so that a distance-measuring solid-state imaging device having excellent distance measuring accuracy can be provided.

Embodiment 2

A solid-state imaging device according to Embodiment 2 of the present disclosure and a drive method of the solid-state imaging device will be described below, mainly focusing on differences from Embodiment 1.

Figure 7:
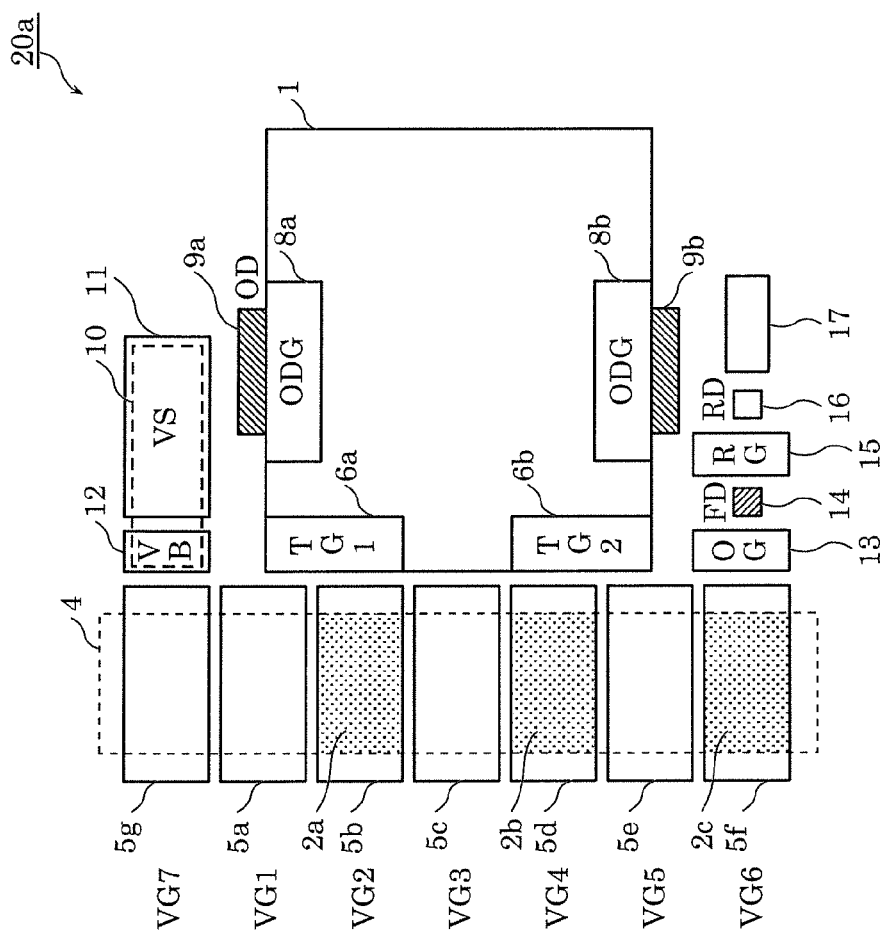
FIG. 7 is a schematic plan diagram illustrating a layout structure of a pixel included in a solid-state imaging device according to Embodiment 2.

FIG. 7 is a schematic plan diagram illustrating a layout structure of pixel 20a included in the solid-state imaging device according to Embodiment 2. The solid-state imaging device according to Embodiment 2 differs from Embodiment 1 in that seven transfer electrodes 5 are arranged. Hence, three charge accumulators 2 can be provided, as compared with Embodiment 1. As illustrated in FIG. 7, pixel 20a includes third charge accumulator 2c in addition to first charge accumulator 2a and second charge accumulator 2b.

In solid-state imaging device 100 according to Embodiment 1, the number of charge accumulators 2 is two.

In Embodiment 2, on the other hand, one charge accumulator 2 for independently obtaining a signal not including distance information, such as background light and dark current and parasitic sensitivity components generated in charge accumulator 2, is added. While suppressing differences in characteristics between distance-measuring signals (signal charges) obtained via two read gates in one frame as in Embodiment 1, distance measuring errors are reduced by removing, in distance calculation, a background light component (hereafter, BG) and a dark current component (hereafter, DS) and a parasitic sensitivity component (hereafter, Sm) generated in charge accumulator 2. To do so, seven electrodes (transfer electrodes 5a to 5g) forming charge coupled devices are provided to enable 7-phase drive as illustrated in FIG. 7, thus increasing the number of signal charges that can be accumulated to three. 8-phase drive is also possible.

The operation will be described below.

After performing interchange operation during exposure, the timings of pulses applied to TG1 and TG2 are interchanged to suppress differences in read characteristics, as in Embodiment 1. In addition, given that dark current component DS and parasitic sensitivity Sm differ among the plurality of charge accumulators 2, the dark current component and parasitic sensitivity of first charge accumulator 2a are denoted by DS1 and Sm1, the dark current component and parasitic sensitivity of second charge accumulator 2b are denoted by DS2 and Sm2, and the dark current component and parasitic sensitivity of third charge accumulator 2c are denoted by DS3 and Sm3, to distinguish them.

Moreover, signal charges by dark current and parasitic sensitivity also occur in charge holder 10, as in charge accumulator 2. These components are accordingly denoted by DSX and SmX. In signal charge interchange operation, charges by dark current DSX and parasitic sensitivity SmX mix into the signal charge that is transferred to charge holder 10 first. Hence, in the case where there are three signals A0, A1, and A2, the three signals need to be equal in the number of times the charge is transferred to charge holder 10 first among the three signals.

Furthermore, the times during which A0, A1, and A2 remain in respective three charge accumulators 2 need to be equal.

Figure 8A:
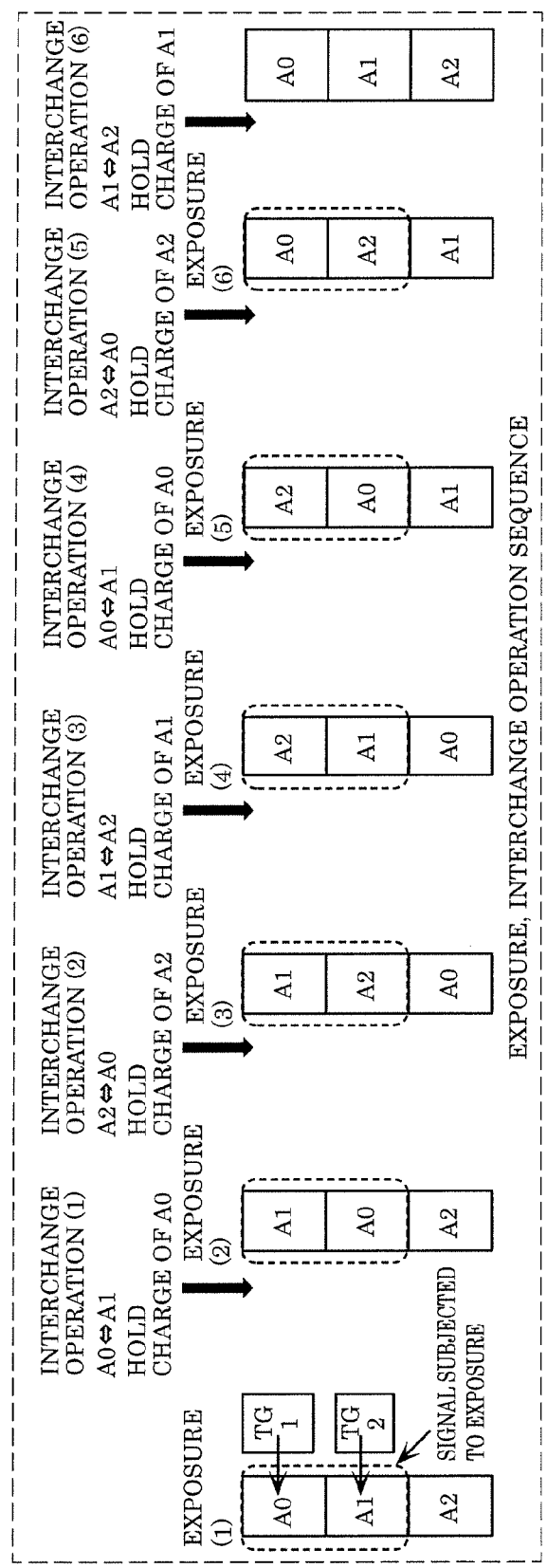
FIG. 8A is a drive timing chart illustrating arrangement of each signal and operation of the solid-state imaging device according to Embodiment 2 during exposure.
Figure 8B:
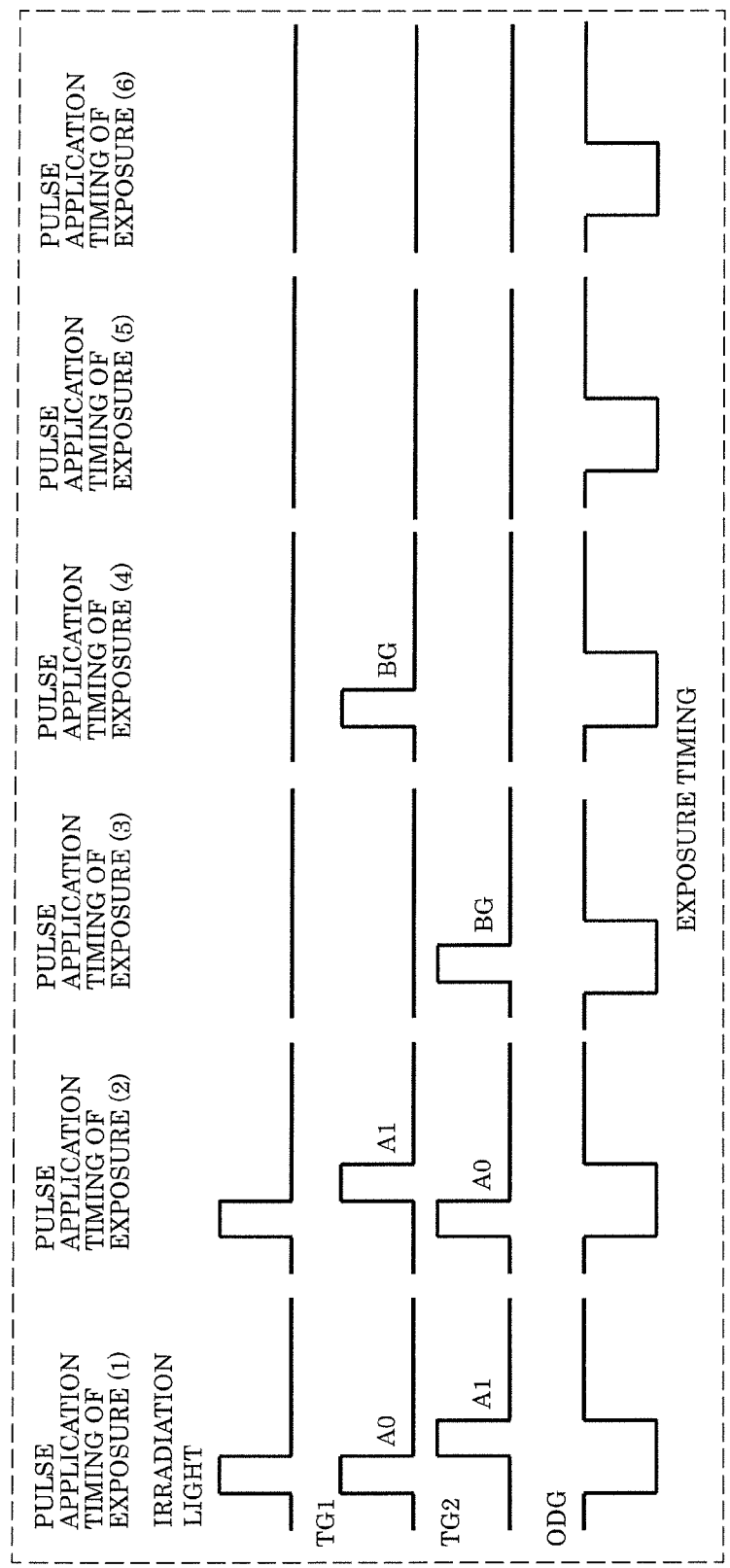
FIG. 8B is a drive timing chart illustrating arrangement of each signal and operation of the solid-state imaging device according to Embodiment 2 during exposure.

FIGS. 8A and 8B are each a drive timing chart illustrating arrangement of each signal and operation of the solid-state imaging device according to Embodiment 2 during exposure. FIG. 8A illustrates an exposure and interchange operation sequence. FIG. 8B illustrates exposure timing. For simplicity, transfer electrodes 5 are omitted, and only first charge accumulator 2a, second charge accumulator 2b, third charge accumulator 2c, and signals accumulated in charge accumulator 2a to 2c are illustrated.

In Embodiment 2, to evenly distribute, among signals, differences in read characteristics, dark current differences and parasitic sensitivity differences of charge accumulators 2, and dark current and parasitic sensitivity of charge holder 10 mixed in each signal in interchange operation, an exposure period is made up of exposures (1) to (6) and interchange operations (1) to (6), as illustrated in FIG. 8A. Exposures (1) to (6) have the same exposure time. For interchange operation of two signals, one of the signals needs to be transferred to charge holder 10. Interchange operations (1) to (6) differ in which signal is transferred to charge holder 10. FIG. 8A also illustrates such signal transferred to charge holder 10.

In first exposure (1), components A0, A1, and A2 are expressed by the following formulas.

$$A0 = A0(TG1) + DS1 + Sm1$$

$$A1 = A1(TG2) + DS2 + Sm2$$

$$A2 = DS3 + Sm3.$$

Herein, (TG1) and (TG2) respectively denote that the signals are read by first read gate 6a to which TG1 is applied and second read gate 6b to which TG2 is applied, as in Embodiment 1.

Between interchange operation (1) and exposure (2), dark current DSX and parasitic sensitivity SmX of charge holder 10 are added to A0 because signal A0 is transferred to charge holder 10 in interchange operation (1), as follows:

$$A0 = A0(TG2) + DS2 + Sm2 + DSX + SmX$$

$$A1 = A1(TG1) + DS1 + Sm1$$

$$A2 = DS3 + Sm3.$$

Between interchange operation (2) and exposure (3), dark current DSX and parasitic sensitivity SmX of charge holder 10 are added to A2 because signal A2 is transferred to charge holder 10 in interchange operation (2). Moreover, in exposure (3), light emission by light source 500 is not performed, and the only read pulse is TG2 and background light component (BG) is read. Accordingly, $$A0 = DS3 + Sm3$$

$$A1 = DS1 + Sm1$$

$$A2 = BG(TG2) + DS2 + Sm2 + DSX + SmX.$$

Between interchange operation (3) and exposure (4), dark current DSX and parasitic sensitivity SmX of charge holder 10 are added to A1 because signal A1 is transferred to charge holder 10 in interchange operation (3). Moreover, in exposure (4), light emission by light source 500 is not performed, and the only read pulse is TG1 and background light component (BG) is read. Accordingly, $$A0 = DS3 + Sm3$$

$$A1 = DS2 + Sm2 + DSX + SmX$$

$$A2 = BG(TG1) + DS1 + Sm1.$$

Between interchange operation (4) and exposure (5), dark current DSX and parasitic sensitivity SmX of charge holder 10 are added to A0 because signal AO is transferred to charge holder 10 in interchange operation (4). Moreover, in exposure (5), light emission by light source 500 is not performed, and no read pulse is applied. Accordingly, $$A0=DS2+Sm2+DSX+SmX$$

$$A1=DS3+Sm3$$

$$A2=DS1+Sm1.$$

Between interchange operation (5) and exposure (6), dark current DSX and parasitic sensitivity SmX of charge holder 10 are added to A2 because signal A2 is transferred to charge holder 10 in interchange operation (5). Moreover, in exposure (6), light emission by light source 500 is not performed, and no read pulse is applied. Accordingly, $$A0=DS1+Sm1$$

$$A1=DS3+Sm3$$

$$A2=DS2+Sm2+DSX+SmX.$$

After interchange operation (6), dark current DSX and parasitic sensitivity SmX of the charge holder are added to A1 because signal A1 is transferred to charge holder 10 in interchange operation (6). Moreover, exposure is not performed, so that other parasitic sensitivity and dark current are substantially negligible, and are taken to be 0. Accordingly, $$A0=0$$

$$A1=DSX+SmX$$

$$A2=0$$

are accumulated in A0, A1, and A2.
Adding the foregoing for each of A0, A1, and A2 yields $$A0=A0(TG1)+A0(TG2)+2\times DS1+2\times Sm1+2\times DS2+2\times Sm2+2\times DS3+2\times Sm3+2\times DSX+2\times SmX$$

$$A1=A1(TG1)+A1(TG2)+2\times DS1+2\times Sm1+2\times DS2+2\times Sm2+2\times DS3+2\times Sm3+2\times DSX+2\times SmX.$$

$$A2=BG(TG1)+BG(TG2)+2\times DS1+2\times Sm1+2\times DS2+2\times Sm2+2\times DS3+2\times Sm3+2\times DSX+2\times SmX.$$

Since signals A0, A1, and BG read by two different read gates 6 are included in A0, A1, and A2 in an added state, differences in read characteristics are canceled out.

Moreover, since dark current and parasitic sensitivity for three charge accumulators 2 and charge holder 10, such as DS1, Sm1, DS2, Sm2, DS3, Sm3, DSX, and SmX, are evenly included in A0, A1, and A2, these signals not related to distance information are not included in calculated differences A0−A2 and A1−A2. Further, given that each exposure time is set to be equal, the background light component included in each of A0(TG1)+A0(TG2) and A1(TG1)+A1(TG2) is equal to BG(TG1)+BG(TG2), and, after calculating the differences, only distance information is obtained. Distance measuring errors can thus be suppressed.

To reduce dark current of charge holder 10, it is desirable to apply a negative voltage to charge holding gate 11 and transfer control gate 12 forming charge holder 10 to cause pinning of the interface of the transfer channel, except when transferring and accumulating a signal charge in interchange operation. In detail, it is desirable that charge holder 10 includes at least a part of a charge holding channel (not illustrated) and at least a part of charge holding gate 11 overlapping with the at least a part of the charge holding channel in a planar view of the semiconductor substrate, and a negative voltage is applied to charge holding gate 11 to cause pinning of the interface between the charge holding channel and charge holding gate 11 in at least a part of a period except a period in which charge holder 10 holds the signal charge.

Moreover, to reduce parasitic sensitivity, it is desirable to provide a light shielding film to cover the whole or part of the periphery of charge holding gate 11 and transfer control gate 12, via an insulating film. In detail, it is desirable to cover at least a part of charge holder 10 with a light shielding film. In an MOS process, wiring is provided at a high position from a gate electrode. Therefore, parasitic sensitivity can be reduced by shielding light by W (tungsten) or the like at a low position separate from the wiring.

Although charge holder 10 is provided within one pixel in FIG. 7, sharing charge holder 10 by a plurality of pixels can reduce parasitic sensitivity and dark current mixing into a signal charge in interchange operation to "1/(the number of sharing pixels)", as compared with the case where charge holder 10 is not shared.

This suppresses a shot noise increase when calculating differences A0−A2 and A1−A2, and reduces distance measuring variations.

FIGS. 8A and 8B concern only the exposure period. However, since respective signals are accumulated in different charge accumulators during a signal read period following the exposure period in one frame period, dark current differences and parasitic sensitivity differences occur in this period, too.

By performing interchange operations (1) to (6) in the signal read period as in the exposure period, dark current and parasitic sensitivity differences which occur in different charge accumulators during this period can also be made equal. In this case, since only signal reading is performed, read pulses TG1 and TG2 in FIG. 8B are unnecessary, and TG1 and TG2 may be constantly in low state, and ODG may be constantly in high state.

As described in detail above, according to Embodiment 2, differences in characteristics due to the positions of read gates 6 can be suppressed without using a plurality of frames, and differences in background light, dark current, and parasitic sensitivity among signals can be suppressed and subtracted, so that a distance-measuring solid-state imaging device having excellent distance measuring accuracy can be provided.

Embodiment 3

Figure 9:
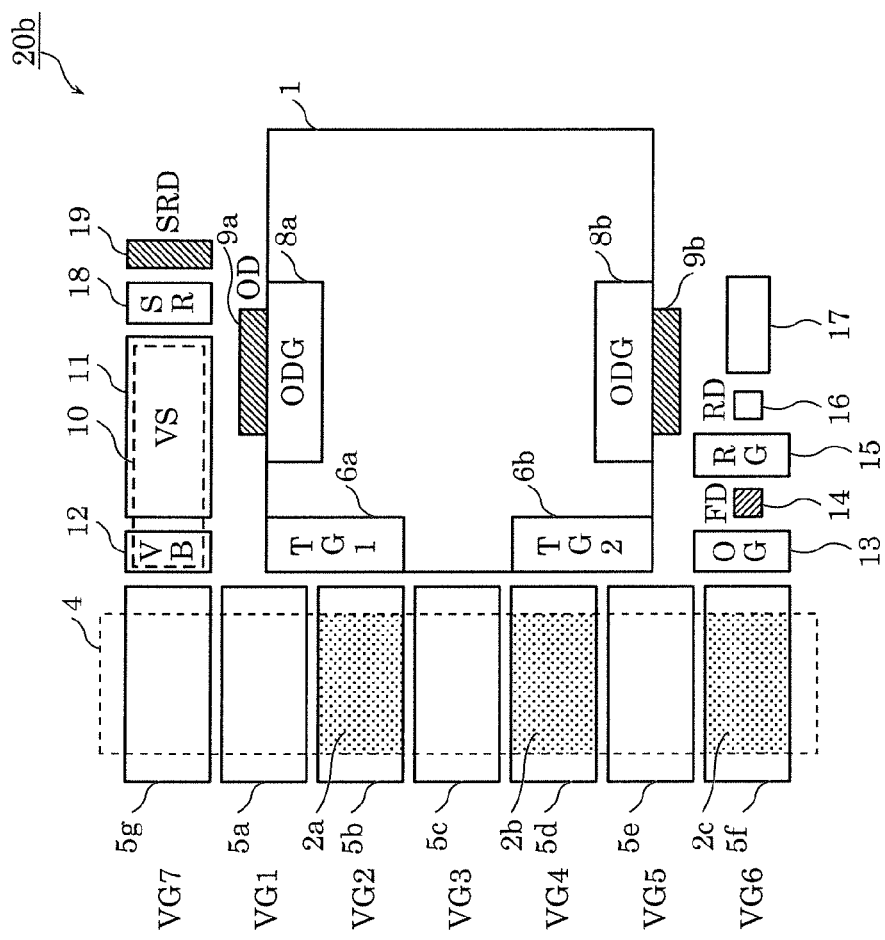
FIG. 9 is a schematic plan diagram illustrating a layout structure of a pixel included in a solid-state imaging device according to Embodiment 3.

FIG. 9 is a schematic plan diagram illustrating a layout structure of pixel 20b included in a solid-state imaging device according to Embodiment 3 of the present disclosure. As illustrated in FIG. 9, pixel 20b includes charge holder reset gate 18 and charge holder reset drain 19. The solid-state imaging device according to Embodiment 3 differs from Embodiment 2 in that charge holder reset gate 18 and charge holder reset drain 19 are added. Accordingly, charge holder reset gate 18 and charge holder reset drain 19 will be mainly described below, while omitting description of other parts as already described.

In both Embodiment 1 and Embodiment 2, it is desirable to set the amount of charge handled by charge holder 10 to be larger than the amount of charge handled by charge accumulator 2, to prevent overflow. However, for example in the case where parasitic sensitivity (SmX) and dark current (DSX) in charge holder 10 are large, it is desirable to add charge holder reset gate 18 and charge holder reset drain 19 that are adjacent to charge holder 10 and control charge accumulation in charge holder 10 and discharge to the drain, that is, charge holder reset drain 19 that discharges at least a part of the signal charge from charge holder 10 and charge holder reset gate 18 that controls the discharge to charge holder reset drain 19, to suppress overflow of charge holder 10.

In addition, by turning on charge holder reset gate 18 before interchange operation to discharge components DSX and SmX accumulated during the exposure period or the signal read period to charge holder reset drain 19, mixing of components DSX and SmX into signals such as A0, A1, and BG transferred to charge holder 10 in the interchange operation can be reduced. This suppresses an increase of shot noise in the subtraction process, and reduces distance measuring variations.

Further, by setting the channel potential when applying low voltage to transfer control gate 12 to be deeper by a predetermined amount than the channel potential when applying low voltage to transfer electrode 5 on transfer channel 4 and setting high voltage to charge holder 10 and charge holder reset gate 18, overflow of charge accumulator 2 formed by a charge coupled device can be reduced, too.

As described in detail above, mixing of dark current and parasitic sensitivity of charge holder 10 into signals necessary for distance calculation can be suppressed, in addition to the effects of Embodiment 2. A distance-measuring solid-state imaging device having more excellent distance measuring accuracy can thus be provided.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to solid-state imaging devices for obtaining distance images of subjects.

What is claimed is:

1. A solid-state imaging device, comprising:
a pixel on a semiconductor substrate, wherein:
the pixel includes:
    a photoelectric converter that converts received light into a signal charge;
    a plurality of read gates that each read the signal charge from the photoelectric converter;
    a plurality of charge accumulators that each accumulate the signal charge read by any one of the plurality of read gates; and
    a charge holder that is arranged apart from a transfer channel in a direction orthogonal to a direction in which the transfer channel extends, and that receives and holds the signal charge from one of the plurality of charge accumulators, and transfers the signal charge to one of the plurality of charge accumulators,
the plurality of read gates include a first read gate and a second read gate, and
the solid-state imaging device comprises a timing generator that performs interchange of a location in which a first signal charge is accumulated and a location in which a second signal charge is accumulated in a case where the first read gate reads the first signal charge and the second read gate reads the second signal charge, and
the timing generator performs the interchange a plurality of times, to cause a total number of times the first signal charge is transferred to the charge holder and a total number of times the second signal charge is transferred to the charge holder to be equal.

2. The solid-state imaging device according to claim 1, comprising:
a plurality of pixels arranged in a matrix, the plurality of pixels each being the pixel,
wherein in the plurality of pixels, the signal charge is read from the photoelectric converter in a same direction in a row direction in arrangement of the plurality of pixels.

3. The solid-state imaging device according to claim 1, wherein each of the plurality of charge accumulators includes a part of a transfer channel for transferring the signal charge and a part of a transfer electrode overlapping with the part of the transfer channel in a planar view of the semiconductor substrate, and
the transfer channel per one pixel comprises one transfer channel.

4. The solid-state imaging device according to claim 1, wherein the first read gate and the second read gate respectively read the first signal charge and the second signal charge, with a first phase difference.

5. The solid-state imaging device according to claim 4, wherein the plurality of charge accumulators include a first charge accumulator and a second charge accumulator, and
the timing generator performs the interchange, after the first read gate reads the first signal charge to the first charge accumulator and the second read gate reads the second signal charge to the second charge accumulator with the first phase difference.

6. The solid-state imaging device according to claim 5, wherein the first read gate reads the signal charge to the second charge accumulator and the second read gate reads the signal charge to the first charge accumulator, with a second phase difference that differs by 180 degrees in phase from the first phase difference.

7. The solid-state imaging device according to claim 1, wherein the timing generator performs the interchange in a signal read period.

8. The solid-state imaging device according to claim 1, wherein the charge holder includes at least a part of a charge holding channel, and at least a part of a charge holding gate overlapping with the at least a part of the charge holding channel in a planar view of the semiconductor substrate, and
a negative voltage is applied to the charge holding gate to cause pinning of an interface between the charge holding channel and the charge holding gate in at least a part of a period except a period in which the charge holder holds the signal charge.

9. The solid-state imaging device according to claim 1, wherein at least a part of the charge holder is covered with a light shielding film.

10. The solid-state imaging device according to claim 1, wherein the pixel further includes:
a charge holder reset drain that discharges at least a part of the signal charge from the charge holder; and
a charge holder reset gate that controls the discharge to the charge holder reset drain.

11. The solid-state imaging device according to claim 1, wherein the pixel further includes:
an overflow drain that discharges at least a part of the signal charge from the photoelectric converter; and
an exposure control gate that controls the discharge to the overflow drain.

12. An imaging apparatus, comprising:
the solid-state imaging device according to claim 1;
a light source that emits infrared light in a pulse form at a plurality of timings; and
a processor that generates a distance image based on an output signal of the solid-state imaging device.

* * * * *